(12) United States Patent
Takahara et al.

(10) Patent No.: US 11,064,617 B2
(45) Date of Patent: Jul. 13, 2021

(54) SWITCH DEVICE FOR VEHICLE

(71) Applicants: TOYO DENSO CO., LTD., Tokyo (JP); HONDA MOTOR CO., LTD., Tokyo (JP)

(72) Inventors: Daiki Takahara, Tsurugashima (JP); Kenichiro Miyadera, Tsurugashima (JP); Masataka Ikeda, Tsurugashima (JP); Yuichiro Kozuka, Tsurugashima (JP); Masahiko Shimada, Wako (JP); Yohei Ohuchi, Wako (JP); Yuichi Nobusawa, Wako (JP)

(73) Assignees: Toyo Denso Co., Ltd., Tokyo (JP); Honda Motor Co., Ltd., Tokyo (JP)

( * ) Notice: Subject to any disclaimer, the term of this patent is extended or adjusted under 35 U.S.C. 154(b) by 64 days.

(21) Appl. No.: 16/716,994

(22) Filed: Dec. 17, 2019

(65) Prior Publication Data
US 2020/0275565 A1 Aug. 27, 2020

(30) Foreign Application Priority Data
Feb. 26, 2019 (JP) .............................. JP2019-032369

(51) Int. Cl.
*H05K 5/00* (2006.01)

(52) U.S. Cl.
CPC .................................. *H05K 5/0021* (2013.01)

(58) Field of Classification Search
CPC . H05K 5/0021; B60K 2370/128; B60K 37/06
See application file for complete search history.

(56) References Cited

U.S. PATENT DOCUMENTS

| 5,876,243 | A | 3/1999 | Sangawa |
| 8,963,031 | B2 | 2/2015 | Fujimoto et al. |
| 9,543,092 | B2* | 1/2017 | Gourdet ................. B60K 37/06 |
| 9,832,894 | B1* | 11/2017 | Lo .......................... B25B 27/02 |
| 2014/0061014 | A1* | 3/2014 | Satou ..................... E05B 81/76 200/302.2 |
| 2014/0061016 | A1* | 3/2014 | Satou ..................... H01H 13/10 200/338 |
| 2017/0153718 | A1* | 6/2017 | Brown ................... G06F 3/0362 |
| 2018/0330902 | A1* | 11/2018 | Takada ................... B60K 37/06 |

FOREIGN PATENT DOCUMENTS

| JP | H09-204842 A | 8/1997 |
| WO | 2011/118268 A1 | 9/2011 |

* cited by examiner

*Primary Examiner* — Rockshana D Chowdhury
(74) *Attorney, Agent, or Firm* — Carrier Blackman & Associates, P.C.; Joseph P. Carrier; William D. Blackman

(57) ABSTRACT

A switch device for a vehicle includes: a case member having on one end side thereof an electrical connection part; and an operating member provided on an opposite end side of the case member to face a vehicle compartment. The case member includes, on an upper wall disposed on an upper side in up-down direction when mounting the case member on a vehicle body interior material: a dividing wall extending in width direction of the case member, orthogonal to the up-down direction, along the material; a first rib extending from the dividing wall toward the one end side and dividing the upper wall into a first region going into the connection part and a second region not going thereinto, and a second rib extending in the first region from an intermediate part of the first rib toward the one end side to partition the dividing wall from the connection part.

6 Claims, 5 Drawing Sheets

SWITCH DEVICE FOR VEHICLE

BACKGROUND OF THE INVENTION

Field of the Invention

The present invention relates to a switch device for a vehicle.

Description of the Related Art

Japanese Patent Application Laid-open No. H09-204842 has made known an arrangement in which a connector is provided on a side face of a power window switch box mounted on an arm rest of a door of an automobile, and in order to prevent the connector from becoming wet with rain water splashing on the switch box, the side face of the switch box is provided with a visor part having an upper water-retaining wall covering the connector from above and a pair of side water-retaining walls guiding downward the rain water that has been guided to the sides of the connector by means of the visor part.

Furthermore, International Publication No. WO2011/118268 has made known an arrangement in which a connector is provided on a lower face of a case of a power window switch unit, a drainer protrudes downward from the lower end of a side face of the case, and rain water splashing on the switch unit is made to drop downward from the drainer via the side of the connector, thus preventing the connector from becoming wet.

In the arrangement described in Japanese Patent Application Laid-open No. H09-204842 above, since it is necessary to provide on the side face of the switch box the visor part having the upper water-retaining wall and the pair of side water-retaining walls, there is a possibility that the switch box will increase in size and it will become difficult to ensure a space for the placement thereof.

The arrangement described in International Publication No. WO2011/118268 above is effective when the connector is provided on the lower face of the switch unit, but there is the problem that the arrangement cannot be applied when the connector is provided on a side face of the switch unit.

SUMMARY OF THE INVENTION

The present invention has been accomplished in light of the above circumstances, and it is an object thereof to reliably prevent an electrical connection part of a switch device for a vehicle from becoming wet.

In order to achieve the object, according to a first aspect of the present invention, there is provided a switch device for a vehicle, comprising a case member having an electrical connection part provided on one end side of the case member and an operating member provided on an opposite end side of the case member so as to face a vehicle compartment, the case member and the operating member being configured to be fixed to a vehicle body interior material, and the case member comprising, on an upper wall disposed on an upper side in an up-down direction when the case member is mounted on the vehicle body interior material, a dividing wall that extends in a width direction of the case member, orthogonal to the up-down direction, along the vehicle body interior material, a first rib that extends from the dividing wall toward the one end side and divides the upper wall into a first region going into the electrical connection part and a second region free of going into the electrical connection part, and a second rib that extends in the first region from an intermediate part of the first rib toward the one end side so as to partition the dividing wall from the electrical connection part.

In accordance with the first aspect, the switch device for a vehicle includes the case member having the electrical connection part provided on the one end side and the operating member provided on the opposite end side of the case member so as to face the vehicle compartment, and the case member and the operating member are fixed to the vehicle body interior material. Since the case member includes, on the upper wall disposed on the upper side in the up-down direction when the case member is mounted on the vehicle body interior material, the dividing wall extending in the width direction of the case member, orthogonal to the up-down direction, along the vehicle body interior material, the first rib extending from the dividing wall toward the one end side and dividing the upper wall into the first region going into the electrical connection part and the second region free of going into the electrical connection part, and the second rib extending in the first region from the intermediate part of the first rib toward the one end side so as to partition the dividing wall from the electrical connection part, even if water that has splashed on the operating member of the switch device for a vehicle within the vehicle compartment flows into the second region beyond the dividing wall of the upper wall, the water is blocked by the first rib, is discharged from the second region, and will not flow toward the electrical connection part. Furthermore, even if water flows into the first region beyond the dividing wall or the first rib, the water is blocked by the second rib, will not flow toward the electrical connection part, and will be discharged from the first region.

According to a second aspect of the present invention, in addition to the first aspect, the dividing wall has a cutout part in at least part of the second region.

According to a third aspect of the present invention, in addition to the first aspect, the upper wall of the case member comprises multiple second ribs as said second rib.

According to a fourth aspect of the present invention, in addition to any one of the first to third aspects, in a state in which the case member is mounted on the vehicle body interior material, the upper wall of the case member is inclined downward from the opposite end side toward the one end side.

Note that a drain outlet 12*g* of embodiments corresponds to the cutout part of the present invention, a dashboard 14 of the embodiments corresponds to the vehicle body interior material of the present invention, and a male connector mounting part 15 of the embodiments corresponds to the electrical connection part of the present invention.

The above and other objects, characteristics and advantages of the present invention will be clear from detailed descriptions of the preferred embodiments which will be provided below while referring to the attached drawings.

DESCRIPTION OF THE PREFERRED EMBODIMENTS

First Embodiment

Figure 1:
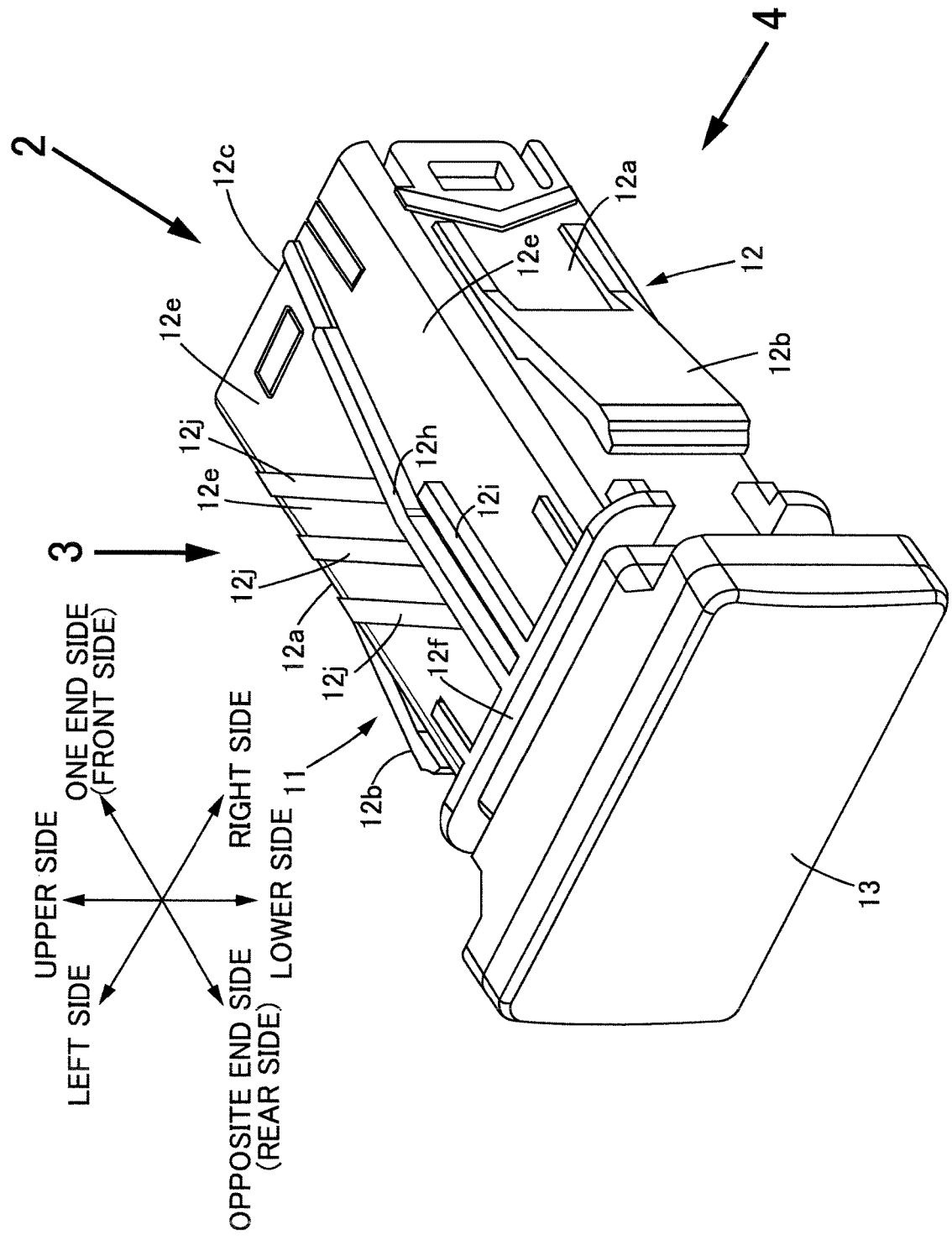
FIG. 1 is a perspective view of a hazard switch for an automobile (first embodiment).
Figure 2:
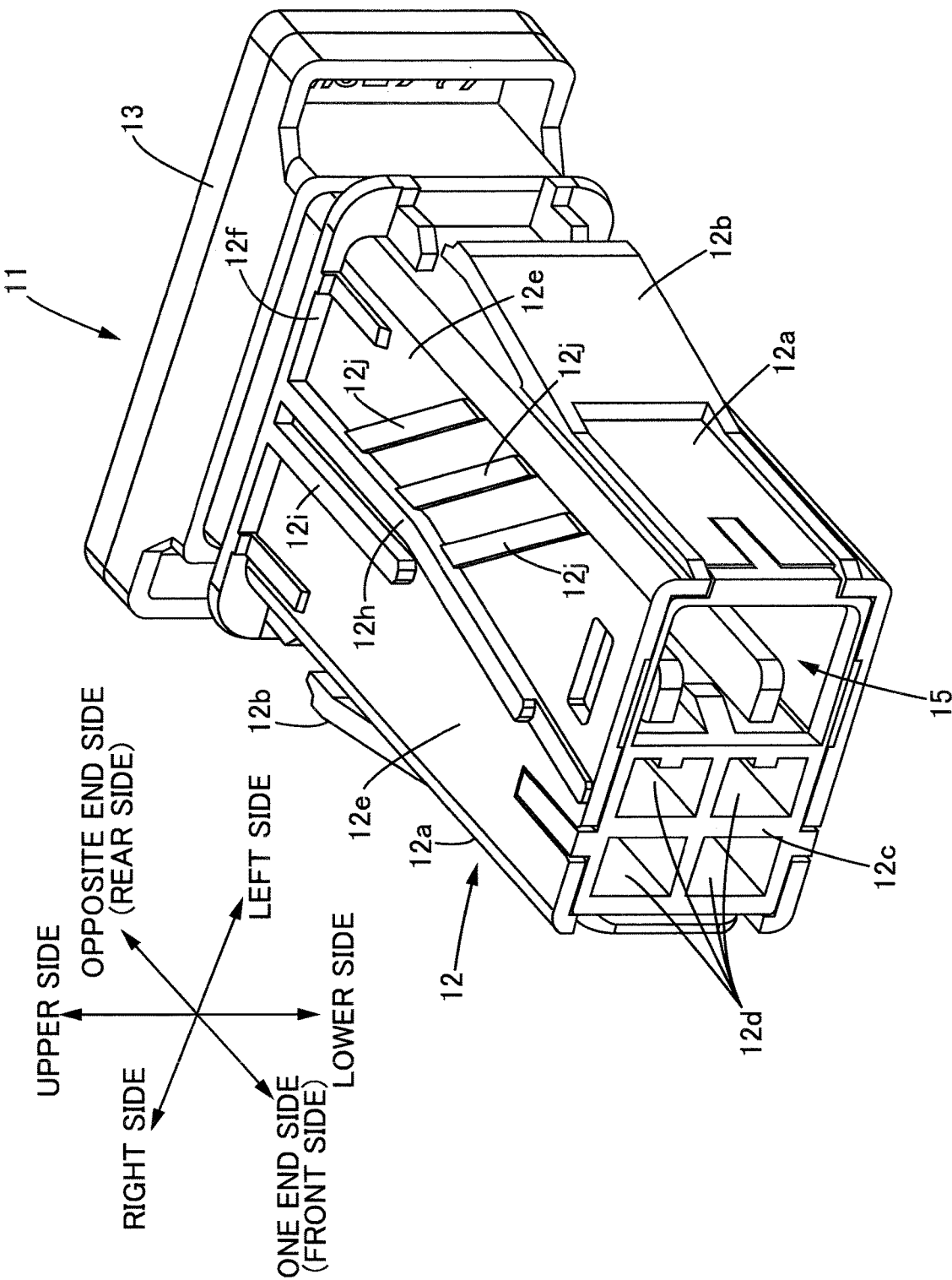
FIG. 2 is a view in the direction of arrow 2 in FIG. 1 (first embodiment).

A first embodiment of the present invention is explained below by reference to FIG. 1 to FIG. 4. In the following description reference numbers corresponding to components of exemplary embodiments are included only for ease of understanding, but the applicants' claims are not limited to the exemplary embodiments or to specific components of the exemplary embodiments. In the present specification, in a state in which a hazard switch 11 is mounted on a vehicle body interior material, a wall face disposed on the upper side in the up-down direction is defined as an upper wall 12e, a width direction, orthogonal to the up-down direction, of a case member 12 is defined as the left-right direction, a side far from an occupant is defined as one end side, and a side close to the occupant is defined as an opposite end side.

The hazard switch 11, which is for turning on and off a hazard lamp of an automobile, includes the substantially rectangular parallelepiped case member 12, and an operating member 13 formed from a push-button provided on the opposite end side (vehicle compartment side) of the case member 12. The hazard switch 11 is mounted on a wall face 14a of a dashboard 14 (see FIG. 3 and FIG. 4) provided at the front end of the vehicle compartment of the automobile by inserting, forward from the vehicle compartment side, the case member 12 into a rectangular mounting hole 14b formed in the wall face 14a of the dashboard 14, and latching a latching claw 12b projectingly provided on left and right side walls 12a of the case member 12 with the edge portion of the mounting hole 14b of the dashboard 14. In this mounted state, the operating member 13 of the hazard switch 11 is disposed on the wall face 14a of the dashboard 14 so as to face the vehicle compartment side, and the occupant pushing the operating member 13 with a finger switches the hazard lamp on and off.

A male connector mounting part 15 is provided on the left side of a forward end face 12c positioned on the one end side (opposite side to the vehicle compartment side) of the case member 12, and a simple recess portion 12d is formed on the right side of the forward end face 12c. A female connector, which is not illustrated, is detachably joined to the male connector mounting part 15.

A rib-shaped dividing wall 12f extending in the left-right direction is projectingly provided on the upper wall 12e of the case member 12 so as to face upward, and this dividing wall 12f is disposed so as to follow the rear face side of the upper edge of the mounting hole 14b of the dashboard 14. A first rib 12h extends forward from a middle part in the left-right direction of the dividing wall 12f, and the front end of the first rib 12h is between the male connector mounting part 15 and the recess portion 12d on the forward end face 12c of the case member 12. The dividing wall 12f and the first rib 12h therefore form a T-shaped wall projecting upward when viewed from above.

Figure 3:
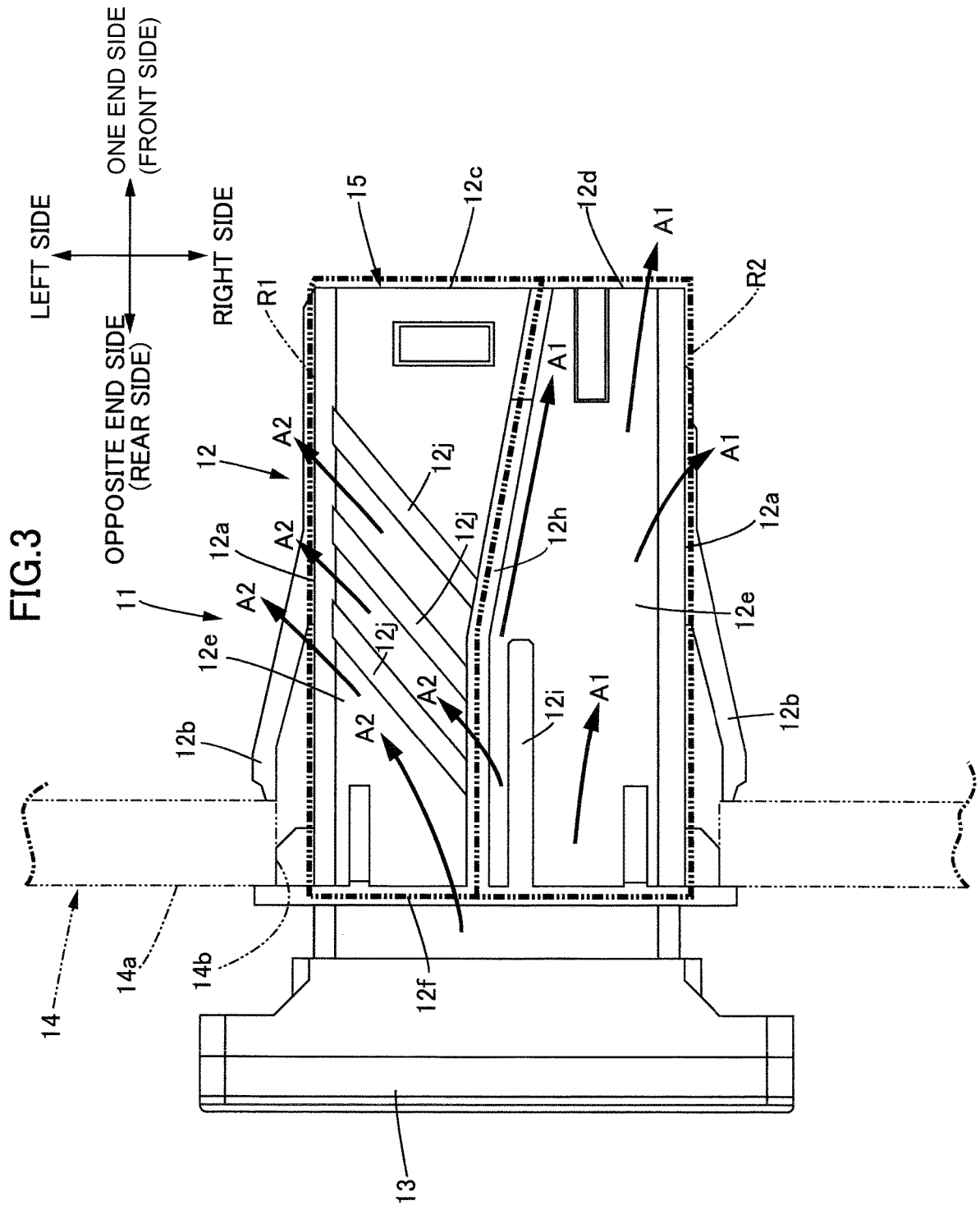
FIG. 3 is a view in the direction of arrow 3 in FIG. 1 when mounted on a vehicle body interior material (first embodiment).
Figure 4:
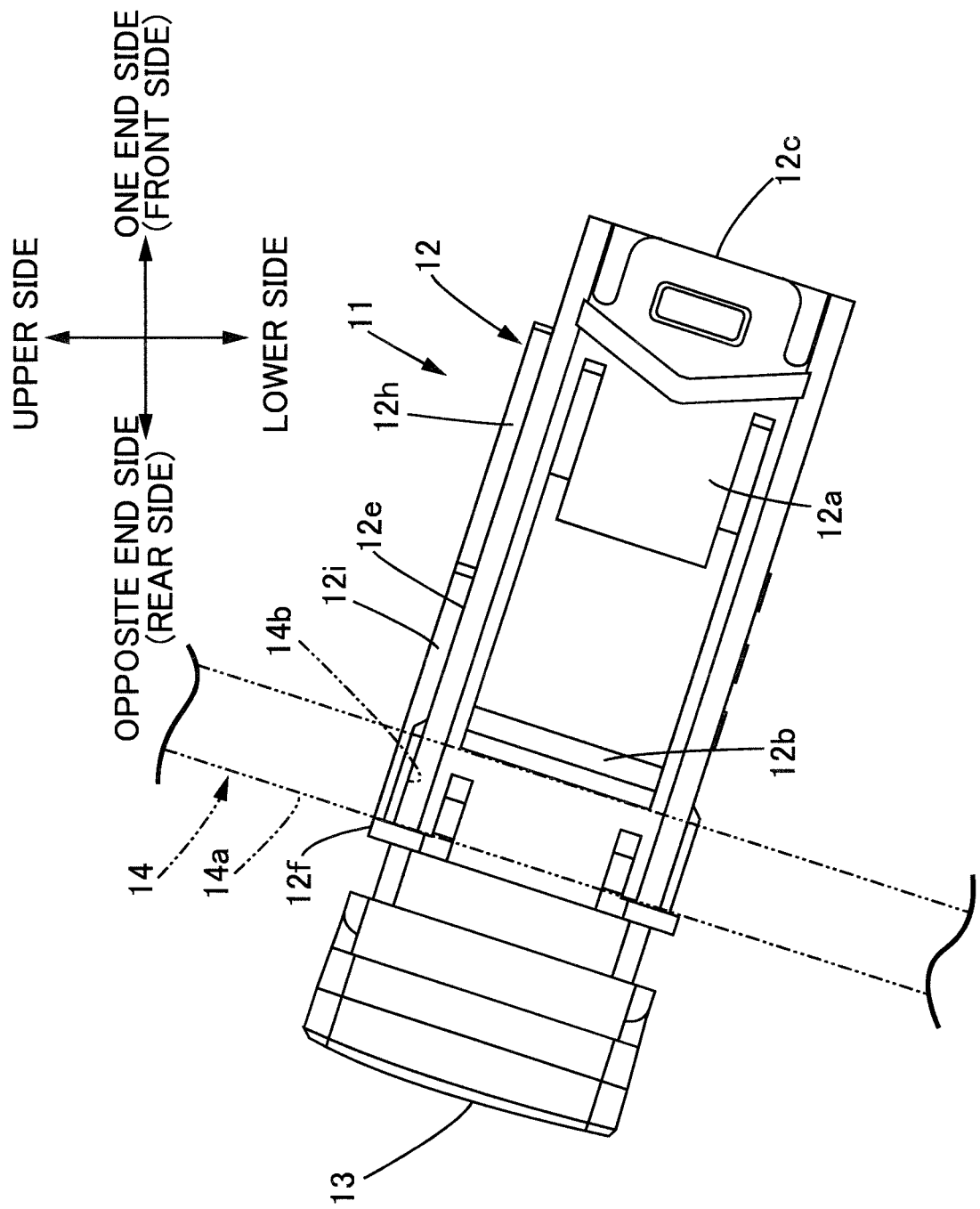
FIG. 4 is a view in the direction of arrow 4 in FIG. 1 when mounted on a vehicle body interior material (first embodiment).

A region on the left side of the first rib 12h on the upper wall 12e of the case member 12, that is, a region on the side where the male connector mounting part 15 is present, is defined as a first region R1 (see FIG. 3), and a region on the right side of the first rib 12h on the upper wall 12e of the case member 12, that is, a region on the side where the male connector mounting part 15 is not present, is defined as a second region R2 (see FIG. 3).

A short rib-shaped erroneous assembly-preventing rib 12i extends forward from the dividing wall 12f; this erroneous assembly-preventing rib 12i is for preventing an erroneous assembly in which the hazard switch 11 is mounted upside down, and it may be omitted.

Furthermore, three second ribs 12j are projectingly provided in the first region R1 of the upper wall 12e of the case member 12 so as to face upward, the second ribs 12j branching from an intermediate part of the first rib 12h and extending in parallel to each other while being inclined forward and leftward. The front end of the second rib 12j reaches the upper end of the side wall 12a on the left side of the case member 12. The height of the second rib 12j is slightly lower than the height of the dividing wall 12f and the height of the first rib 12h (see FIG. 2).

The hazard switch 11 thus arranged is disposed so that, when mounted on the dashboard 14, the upper wall 12e of the case main body 12 is inclined downward from the opposite end side toward the one end side.

The operation of the embodiment of the present invention having the above arrangement is now explained.

When an occupant spills a drink within the vehicle compartment, rain water blows into the vehicle compartment via an open door or window, or rain water drips from an umbrella brought into the vehicle compartment by an occupant, and the drink or rain water (hereinafter, simply called water) splashes on the operating member 13 of the hazard switch 11, the water passes through the mounting hole 14b formed in the wall face 14a of the dashboard 14 and flows on the upper wall 12e of the case member 12 of the hazard switch 11 from the opposite end side toward the one end side, and the male connector mounting part 15 provided on the forward end face 12c of the case member 12 will become wet, thus giving rise to the possibility that a malfunction will be caused.

However, in accordance with the present embodiment, since the water passing through the mounting hole 14b of the dashboard 14 is blocked by the dividing wall 12f of the upper wall 12e of the case member 12, the male connector mounting part 15 is prevented from becoming wet due to the water flowing on the upper wall 12e of the case member 12. Water that has flowed into the second region R2 of the upper wall 12e beyond the dividing wall 12f is blocked by the first rib 12h formed on the middle part in the left-right direction of the upper wall 12e and is prevented from flowing into the first region R1, drops along the side wall 12a on the right side of the case member 12 where the male connector mounting part 15 is not present, or along the recess portion 12d on the right side of the forward end face 12c of the case member 12, and is discharged (see arrow A1 in FIG. 3). In this arrangement, since the upper wall 12e of the case member 12 is inclined downward from the opposite end side toward the one end side, the water can be discharged quickly by making it flow smoothly along the upper wall 12e.

When a large amount of water splashes on the operating member 13 of the hazard switch 11, there is a possibility that water that has passed through the mounting hole 14b of the dashboard 14 will flow directly into the first region R1 beyond the dividing wall 12f of the upper wall 12e of the case member 12 or will flow into the first region R1 from the second region R2 beyond the first rib 12h. However, since the three second ribs 12j, which extend while being inclined from the intermediate part of the first rib 12h toward the one end side and the left side of the case member 12, are provided in the first region R1 of the upper wall 12e of the case member 12, the flow of water that has passed beyond the dividing wall 12f or the first rib 12h is deflected leftward by means of the three second ribs 12j, and the water drops along the side wall 12a on the left side of the case member 12 prior to the male connector mounting part 15 and is discharged (see arrow A2 in FIG. 3). As a result, the male connector mounting part 15 is more reliably prevented from becoming wet.

As described above, in accordance with the present embodiment, since the dividing wall 12f, the first rib 12h, and the second rib 12j are provided on the upper wall 12e of the case member 12 and do not protrude sideways, it is possible to minimize any increase in the size of the case member 12, easily ensuring a mounting space. Moreover, even if the male connector mounting part 15 is provided not on the lower face of the case member 12 but on the forward end face 12c, which is a side face, it can reliably be prevented from becoming wet.

Second Embodiment

Figure 5:
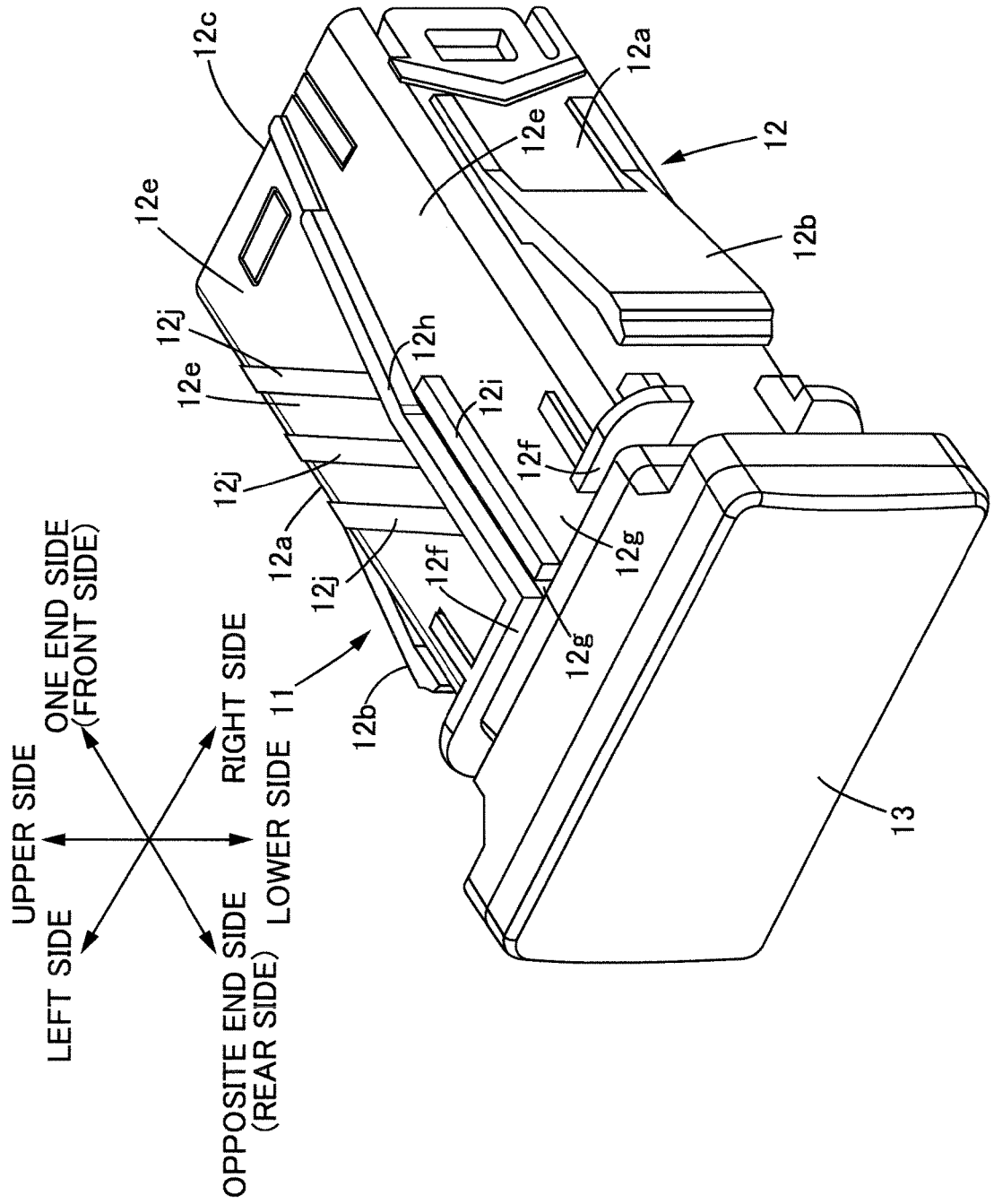
FIG. 5 is a perspective view of a hazard switch for an automobile (second embodiment).

A second embodiment of the present invention is now explained by reference to FIG. 5.

In the second embodiment, a drain outlet 12g communicating with the second region R2 is formed in part of the dividing wall 12f.

In accordance with the present embodiment, the majority of water passing through the mounting hole 14b of the dashboard 14 passes through the drain outlet 12g of the dividing wall 12f and flows into the second region R2, and is discharged without the male connector mounting part 15 becoming wet. As a result, the amount of water flowing directly into the first region R1 beyond the dividing wall 12f decreases, and it becomes possible to more reliably prevent the male connector mounting part 15 from becoming wet.

Embodiments of the present invention are explained above, but the present invention may be modified in a variety of ways as long as the modifications do not depart from the gist of the present invention.

For example, the switch device for a vehicle of the present invention is not limited to use in the hazard switch 11 of the embodiments and may be applied to any switch device for a vehicle.

Furthermore, the vehicle body interior material of the present invention is not limited to the dashboard 14 of the embodiments and may be any vehicle body interior material such as a door inner wall.

Moreover, the electrical connection part of the present invention is not limited to the male connector mounting part 15 of the embodiments; it may be a female connector mounting part, and may be a guide part that guides one connector to another connector housed in the interior of the case member 12.

Furthermore, in the embodiments the male connector mounting part 15 is provided on the left side of the one end side of the case member 12, but the male connector mounting part 15 may be provided on the right side of the one end side of the case member 12.

Moreover, in the embodiments three of the second ribs 12j are provided, but any number of second ribs 12j may be employed.

Furthermore, in the embodiments the upper wall 12e of the case member 12 is inclined downward from the opposite end side toward the one end side, but the upper wall 12e of the case member 12 may be disposed horizontally.

Moreover, in the embodiments the drain outlet 12g is formed by cutting out part of the dividing wall 12f but, in the upper wall 12e of the case member 12, the dividing wall 12f may be provided on the entirety of one of left and right halves, and the drain outlet 12g may be provided on the entirety of the other of the left and right halves.

What is claimed is:

1. A switch device for a vehicle, comprising a case member having an electrical connection part provided on one end side of the case member and an operating member provided on an opposite end side of the case member so as to face a vehicle compartment, the case member and the operating member being configured to be fixed to a vehicle body interior material, and the case member comprising, on an upper wall disposed on an upper side in an up-down direction when the case member is mounted on the vehicle body interior material, a dividing wall that extends in a width direction of the case member, orthogonal to the up-down direction, along the vehicle body interior material, a first rib that extends from the dividing wall toward the one end side and divides the upper wall into a first region going into the electrical connection part and a second region free of going into the electrical connection part, and a second rib that extends in the first region from an intermediate part of the first rib toward the one end side so as to partition the dividing wall from the electrical connection part.

2. The switch device for a vehicle according to claim 1, wherein the dividing wall has a cutout part in at least part of the second region.

3. The switch device for a vehicle according to claim 1, wherein the upper wall of the case member comprises multiple second ribs as said second rib.

4. The switch device for a vehicle according to claim 1, wherein in a state in which the case member is mounted on the vehicle body interior material, the upper wall of the case member is inclined downward from the opposite end side toward the one end side.

5. The switch device for a vehicle according to claim 2, wherein in a state in which the case member is mounted on the vehicle body interior material, the upper wall of the case member is inclined downward from the opposite end side toward the one end side.

6. The switch device for a vehicle according to claim 3, wherein in a state in which the case member is mounted on the vehicle body interior material, the upper wall of the case member is inclined downward from the opposite end side toward the one end side.

* * * * *